United States Patent
Cassagrande et al.

(10) Patent No.: US 6,628,184 B1
(45) Date of Patent: Sep. 30, 2003

(54) FIELD CONFIGURABLE CONTACTS AND CONTACTOR

(75) Inventors: Robert J. Cassagrande, Oxford, CT (US); David J. Lesslie, Plainville, CT (US); Charles S. Pitzen, Farmington, CT (US); Alberto A. Figueroa, Southington, CT (US); Efrain Ralat, Vega Baja, PR (US); Jose F. Gonzalez, Bayamon, PR (US); M. Natarajan, Bangalore (IN); A. Ramadevi, Bangalore (IN); Anilkumar D. Pandit, Bangalore (IN); Madhu Sudan, Bangalore (IN); K. V. Sridhar, Bangalore (IN); Thuong H. Phung, Bristol, CT (US); Dennis C. Zuffelato, Kensington, CT (US); Joseph P. Smith, Dorchester, MA (US)

(73) Assignee: General Electric Company, Schenectady, NY (US)

( * ) Notice: Subject to any disclaimer, the term of this patent is extended or adjusted under 35 U.S.C. 154(b) by 387 days.

(21) Appl. No.: 09/716,655

(22) Filed: Nov. 20, 2000

(51) Int. Cl.[7] .......................... H01H 3/00; H01H 67/02
(52) U.S. Cl. .................. 335/132; 335/129; 335/190
(58) Field of Search .................. 335/106, 127–135, 335/159–163, 185, 189, 190

(56) References Cited

U.S. PATENT DOCUMENTS

| | | | |
|---|---|---|---|
| 3,198,910 A | | 8/1965 | Burch et al. |
| 4,087,770 A | * | 5/1978 | Kuhn et al. .................. 335/132 |
| 4,184,134 A | * | 1/1980 | Kane et al. .................. 335/198 |
| 4,430,579 A | | 2/1984 | Wiktor |

* cited by examiner

*Primary Examiner*—Ramon M. Barrera
(74) *Attorney, Agent, or Firm*—Cantor Colburn LLP

(57) ABSTRACT

A field configurable contactor is disclosed. The contactor preferably includes a plurality of spaces adapted to receive any number, up to its limit, of contact modules. Each contact module preferably includes a pair of contacts and a spring biased cam follower which opens and closes the contact pair when a cam profile of the contactor moves according to energization or de-energization of the contactor. The contact module can be either "normally open" or "normally closed" depending on its initial placement onto the contactor relative to the cam profile. A latch assembly in the contactor may hold the contactor mechanically during de-energization.

34 Claims, 13 Drawing Sheets

FIELD CONFIGURABLE CONTACTS AND CONTACTOR

BACKGROUND OF THE INVENTION

The present invention relates to power contacts and a receiving contactor, and more particularly relates to adjustments which may be made to the contacts or contactor within the field.

Contactors for motor, lighting, and general purpose applications are generally designed with one or more power contacts. These contacts change state when the contactor is energized. As new circuits are added, new poles must be added to the contactor. Manufacturers have solved this problem by offering contactors with 2 to 12 poles. All these contactors are designed with a common base that is manufactured for a specific number of contacts. Contacts cannot be added in the field without disassembling the contact, if it is even possible at all. Today, the quantity of contacts in a multi-pole contactor must be selected before the unit is shipped from the factory. As a result of this, contactors cannot be upgraded in the field to add poles when the application requires. This also results in a significant inventory of finished goods.

To solve the above-described problem, some manufacturers have produced single adder poles which can be assembled to a 3 or 4 pole frame to add one pole. These adder pole kits often require the complete disassembly of the contactor and the replacement of several parts. Some adder pole kits are restricted to low power contact blocks and often only for control functions.

It is common practice to use multiple normally open and normally closed contacts within a contactor. A distributor would not normally know the exact configuration of normal open and normal closed poles when the contactor is ordered. Today, the function of contacts in a multi-pole contactor must be selected before the unit is shipped from the factory. As a result of this, when the function of the contact needs to be changed, the contactor must be completely disassembled to make a change. This also adds significant material cost because contacts must be included for both forms of contacts with every unit.

To solve the above described problem, some manufacturers use symmetrical contacts, which can be changed from normal open to normal closed and back by completely disassembling the unit and reversing the springs and parts. Also, low power level contacts are sometimes designed in modular units, which can be replaced to provide contact form change.

Lighting contactors are either electrically or mechanically held contactors used to control lighting in commercial and industrial applications. Today, a customer must purchase two different products, which are not easily interchangeable to serve both applications. This also enables the customer to manually operate the contactor in the event of a control power circuit failure. Also, the manufacturer, distributor, and installer must inventory two different products for mechanically and electrically held applications. This drives significant manufacturing cost due to the reduced volume in each line, and cost of inventory. In addition, since the two products are dissimilar, they are not interchangeable in the field, increasing the cost of future retrofit.

To solve the above-described problem, some manufacturers provide an accessory that can be applied to a contactor to mechanically latch the contactor. Although this solves the problem, often the height of the contactor is significantly increased, because this design utilizes a second coil. The second coil also reduces the reliability of the design and adds to the cost and weight of the contactor.

BRIEF SUMMARY OF THE INVENTION

In an exemplary embodiment of the invention, a contactor for receiving contact modules and a contact module receivable in the contactor includes a contactor having a cover, the cover having cam openings, each cam opening providing access to first and second cam profiles raised from first and second sides of a flat surface, respectively, each cam profile including a raised surface and a sloped surface connecting the raised surface to the flat surface.

The contact module receivable on the contactor preferably includes a housing, a stationary contact positioned within the housing, a spring-biased cam follower protruding from the housing, a spring for biasing the cam follower, a plunger extending from the cam follower and through the housing, the plunger movable with the cam follower, a module plate extending from the plunger, the module plate movable with the plunger and cam follower, a movable contact on the module plate, the movable contact movable with the module plate, wherein the cam follower is movable along its longitudinal axis from a first position where the movable contact abuts the stationary contact to a second position where the movable contact is separated from the stationary contact.

Initially positioning the cam follower of the contact module upon the first cam profile in the contactor results in a normally closed contact module with the cam follower placed on a raised surface forcing the cam follower into the second position, and initially positioning the cam follower of the contact module upon the second cam profile results in a normally open contact module with the cam follower resting on a flat surface and allowing the cam follower to be in the first position.

The contactor may additionally include a latch assembly for mechanically holding the contactor during de-energization of the contactor, the latch assembly preferably including a latching bar having a first end and a second end, a latch plunger, the latch plunger having a head portion, a neck portion, and main body portion, the head portion of the latch plunger for connecting with a connector extending from an electromagnetically driven portion of the contactor, the neck portion of the latch plunger having a slot for receiving the first end of the latching bar, the main body portion containing a closed loop pathway for receiving the second end of the latching bar, and a latch assembly base and a latch assembly cover forming a chamber for receiving the latch plunger therein, the latch plunger slidable from a bottom end to a top end of the chamber. The first end of the latching bar extends through an opening in the latch assembly cover and the second end of the latching bar extends through an aperture in the latch assembly cover.

DETAILED DESCRIPTION OF THE INVENTION

Figure 1:
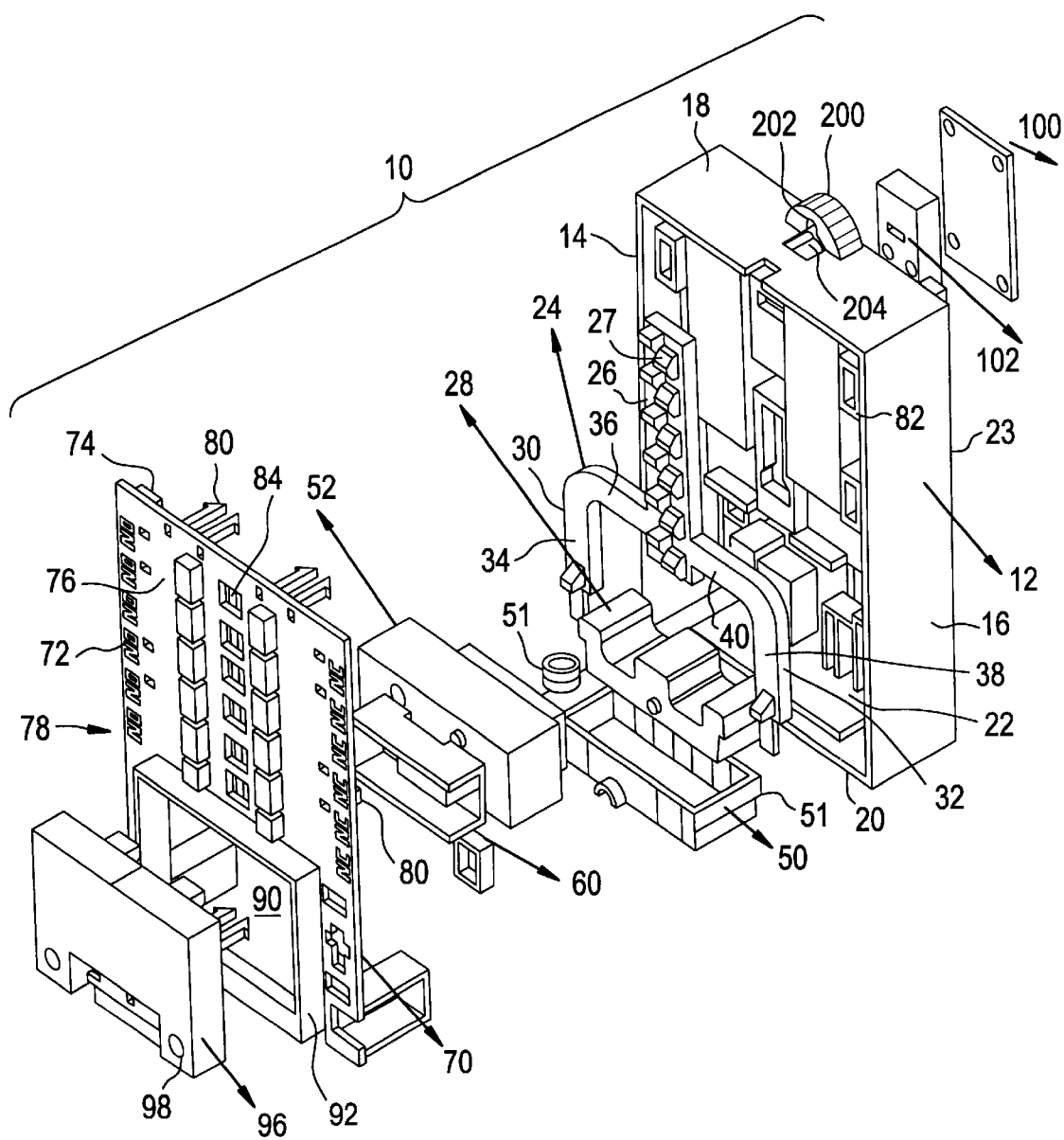
FIG. 1 shows an exploded perspective view of a contactor of the present invention.

As shown in FIG. 1, a contactor 10 of the present invention includes a base 12 having a first side 14, second side 16, top side 18, and bottom side 20. A front 22 of the base 12 is adapted for receiving a main cam 24 which includes a cam profile leg 26 supporting cam profiles as will be described further below. An armature 28 is positioned between supporting arms 30, 32 of the main cam 24. A first supporting arm 30 includes a first extension 34 adjacent the armature 28 and running generally alongside the first side 14. A first connecting arm 36 extends angularly from the first extension 34 and connects the first extension 34 to the cam profile leg 26 such that a longitudinal axis of the cam profile leg 26 is preferably generally parallel to a longitudinal axis of the first extension 34. Similarly, the second supporting arm 32 includes a second extension 38 running generally parallel to the second side 16 and a second connecting arm 40 extending angularly from the second extension 38 and connecting the second extension 38 to the cam profile leg 26, which is supported to be preferably generally parallel to a longitudinal axis of the second extension 38.

The contactor 10 further preferably includes a bobbin 60 about which a coil (not shown) is wound and which has terminals for fixing connecting wires. A middle limb of the magnet 52 is inserted in the hole of the bobbin 60 from one side, and the magnet along with the bobbin is fitted in the base 12, being inserted through the opening provided in the cover 70. It is held captive within the base through two pins, or other attachment devices, fitted in it and which are held tightly in the base. This permits change or replacement of the coil if necessary even after installation.

Further received in the front 22 of the base 12 is an armature holder 50, which may have a generally rectangularly shaped receiving space as shown, for receiving armature 28 therein. The armature 28 is inserted in the armature holder 50 and held captively inside it by a pin driven through the armature 28 and armature holder 50. The assembly of the armature 28 and the armature holder 50 is placed in the base 12 before fitting the cover 70 thereon. After fitment of cover 70, the armature assembly is held under the cover 70 but free to move towards the magnet 52 or away from it, where the magnet 52 is located between the first and second connecting arms 36, 40 of the main cam 24 and the armature assembly 28, 52. In a de-energized state, a gap exists between the magnet 52 and the armature assembly 28, 52. Projections 51 of the armature holder 50 are positioned adjacent (below) the main cam arms 32 and 34. The main cam 24 is pushed towards bottom side 20 of the base 12 by a spring bias. Such springs may be located between a projection on the rear side of the main cam 24 and the base 12. The biased main cam 24 also pushes the armature holder 50 as well as the armature 28 towards the bottom side 20. However, when the coil is energized, the armature 28 and armature holder 50 is pulled towards the magnet 52, thus closing the gap between the magnet 52 and the armature assembly 28, 52. This also results in the main cam 24 being pushed against its spring bias. The magnet 52 is thus positioned within the base to act upon the armature 28, which in turn results in movement of the main cam 24, when the contactor 10 is in an energized state. The motion of the main cam 24 results in a change of state of all contacts in the contact modules, as will be further described. When the coil is de-energized, the spring bias on the main cam 24 pushes it down back towards side 20 which in turn pushes back the armature holder 52 as well as the armature 28, and it also results in all contacts reverting back to their normal state.

Placed over the above-described elements of the contactor 10 and over the front 22 of the base 12 is a cover 70, having an exterior periphery 72 generally matching the exterior periphery of the base 12, which, as shown, may be generally rectangular. The cover 70 includes a rear surface 74 facing the front 22 of the base 12 and a front surface 76 forming the front 78 of the contactor 10. The cover 70 may further include prongs, or pairs of prongs 80 as shown, extending from the rear surface 74 of the cover 70. The prongs 80 may be slightly resiliently biased to form snap-fit projections receivable within detents 82 formed on the front 22 of the base 12. Thus, the cover 70 may be simply snapped onto the base 12, thereby enclosing the elements of the contactor 10 within. Within the cover 70, several openings 84 are provided, each for receiving a cam profile 27 formed upon the cam profile leg 26. That is, when the cover 70 is secured to the base 12, the cam profiles 27 are visible and preferably extend at least partially through opening 84.

The cover 70 further includes a cut out 90 which may have a peripheral lip 92 extending above the front surface 76. The cut out 90 is sized to accept a coil and magnet assembly therein, and is then preferably covered with coil cover 96. The coil cover 96 may also be secured with a snap-fit attachment, screwed on, or otherwise attached thereto.

A rear 23 of the base 12 may include a latch cover 100 covering a latch assembly 102 adjacent the top side 18 of the base 12, as will be further described.

Extending exteriorly from the top side 18 may be a hanger 200 have a key-hole shaped aperture 202 for enabling receipt of a screw or nail head through a larger part of the aperture 202 and hanging the contactor 10 in place by allowing the thinner body of the screw or nail to slide within the smaller part of the aperture 202. The top side 18 and adjacent rear 23 of the base 12 may include a recess 204 which forms part of the larger part of aperture 202.

Figure 2:
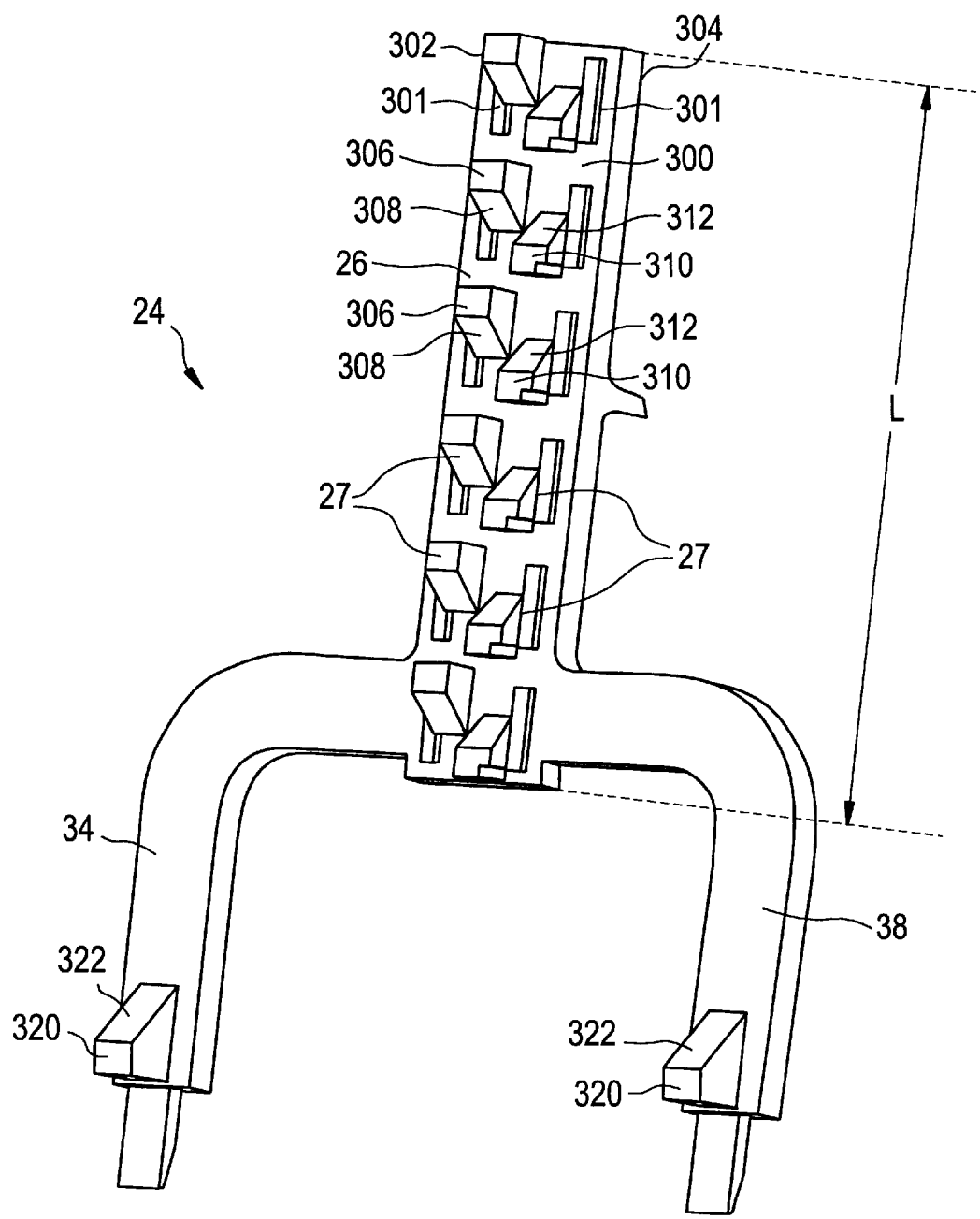
FIG. 2 shows a front perspective view of a main cam for use with the contactor of FIG. 1.
Figure 3:
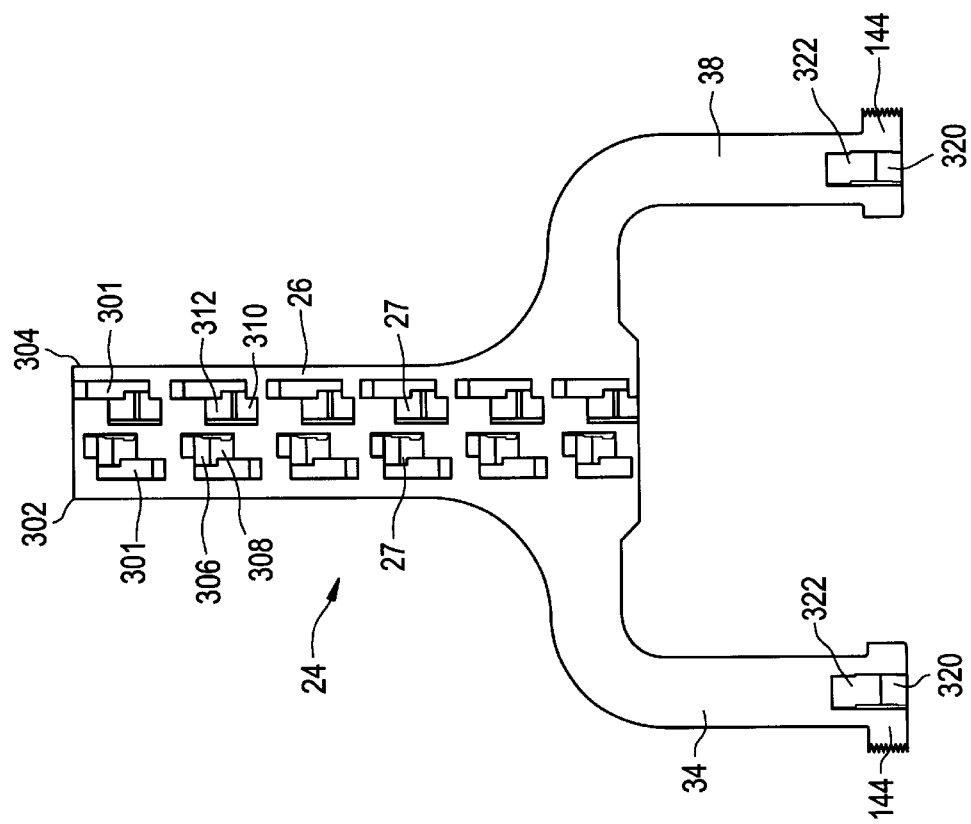
FIG. 3 shows a front plan view of the main cam of FIG. 2.
Figure 4:
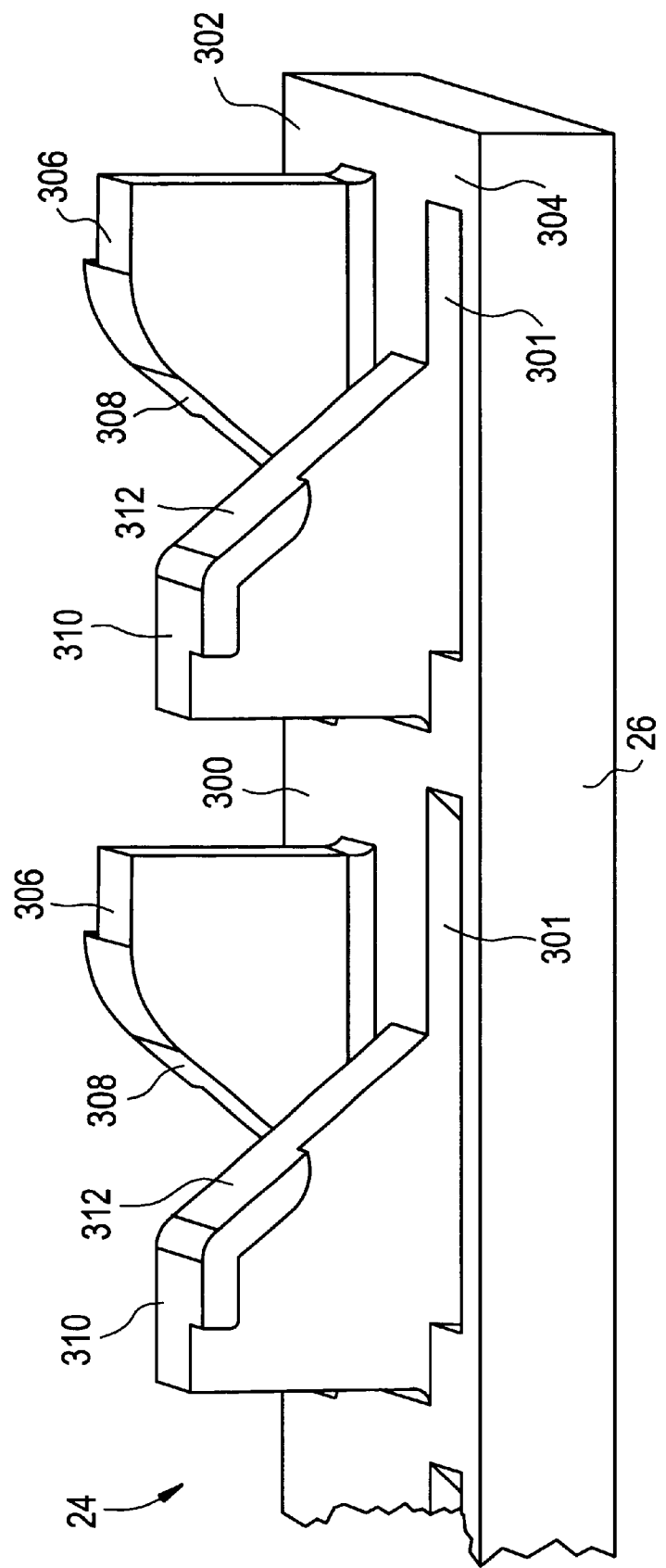
FIG. 4 shows a partial side perspective view of a cam profile leg of the main cam of FIG. 2.

Turning now to FIGS. 2–4, the main cam 24 is shown in an enlarged fashion to clarify the cam profiles 27 which are on the cam profile leg 26. The cam profiles 27 include six pairs of raised surfaces, which correspond to the possibility of adding six contact modules in one of two initial positions. It is within the scope of this invention to provide more or less cam profiles 27 corresponding to the number of possible contact modules intended for use on a particular contactor. The cam profile leg 26 includes a front flat surface 300 from which the cam profiles 27 protrude. The front flat surface 300 of the cam profile leg 26 includes a first side 302 (i.e. first half) and a second side 304 (i.e. second half), where the first side 302 is closer to the first side 14 of the contactor 10 and the second side 304 is closer to the second side 16 of the contactor 10. The first side 302 includes a first set of raised surfaces 306 and slopes 308 connecting the raised surfaces 306 to the flat surface 300. The second side 304 includes a second set of raised surfaces 310 and slopes 312 connecting the raised surfaces 310 to the flat surface 300. The raised surfaces 306, 310 are linearly offset from each other. That is, the cam profile leg 26 has a length L (which follows the longitudinal axis of the cam profile leg 26) and each raised surface 306, 310 occupies a discrete portion along that length L. The slopes 308 and 312 may overlap each other along the length L. This linear displacement of the raised surfaces 306, 310 causes the cam follower of a contact module (as will be further described) to be in activated or non-activated position depending whether the first side 302 or second side 304 is being used to drive the contact module. Slots 301 are preferably provided adjacent each cam profile 27 for receipt of an extension extending from the contact modules as will be further described. Additional raised surfaces 320 are provided on the first and second extensions 34, 38 and also include slopes 322 connecting the raised surfaces 320 to the flat surface 300. These raised surfaces 320 are used for interacting with auxiliary contact blocks as will be described.

Figure 5:
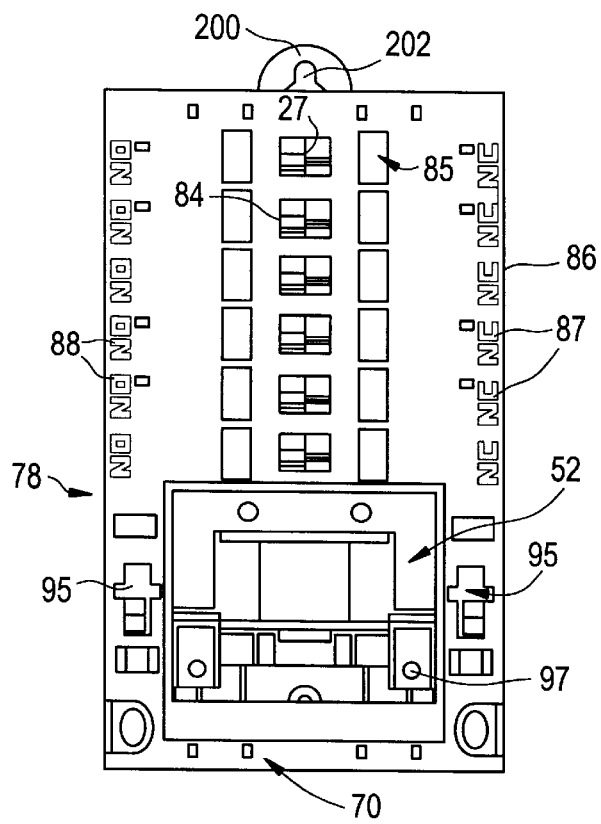
FIG. 5 shows a front plan view of the contactor of FIG. 1 with a coil cover removed.
Figure 6:
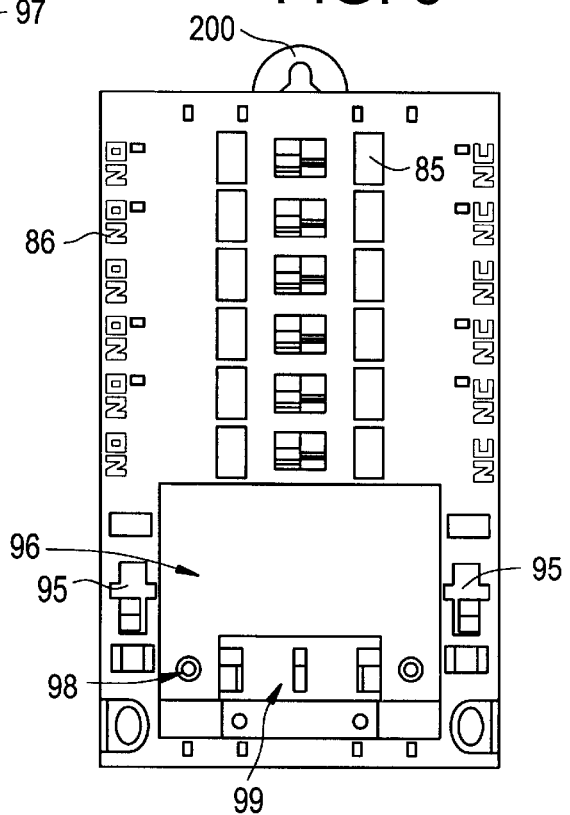
FIG. 6 shows a front plan view of the contactor of FIG. 1 with a coil cover in place.

Turning now to FIGS. 5–6, the front 78 of the contactor 10 is shown with the main cover 70 in place. The coil cover 96 is shown removed in FIG. 5, and snapped into place in FIG. 6. The coil cover 96 may further include apertures 98 providing access to coil terminals 97 and also access to view the coil rating marked on the bobbin 60.

Further viewable on the front 78 of the contactor 10 are the cam profiles 27, as described with respect to FIGS. 2–4, accessible through the openings 84. Attachment areas 85 indicate locations for attaching contact blocks or modules to the contactor 10. The attachment areas 85 may comprise rectangular protrusions, or other suitably shaped protrusions, raised from the front surface 74 of the cover 70, which may have tunnel shaped, e.g. upside down U-shaped cross-sections. As will be further described, the contact modules preferably include complementary hooks for securing the modules to the attachment areas 85. Indicia 86, including the abbreviations NC 87 for "normally closed" and abbreviations NO 88 for "normally open" contacts are preferably provided on the surface 74 of the main cover 70. While the NO/NC configuration of the contacts may be decided and configured at the field location, the indicia 86 provides an indication of the contacts positioned on the attachment areas 85 by leaving visible the abbreviation 87 or 88 indicating the function of the contacts contained within the contact modules as positioned.

Also provided on the front surface 74 of the main cover 70 are locations (apertures) 95 for placing auxiliary contact blocks. The contacts in these auxiliary contact blocks will change their state as the main cam travels from its un-energized to energized position or vice versa. These auxiliary contacts are used to provide local or remote indication of the status of the main contacts, interlocking function with other circuits, etc. An auxiliary contact block may provide feedback to an electronic timer as to contact state for mechanically held version of the contactor 10, as will be further described. Accessible within the locations 95 are the raised surfaces 320 and their corresponding slopes 322 which move with the main cam 24 in an energized state to change the state of the contacts contained within the auxiliary contact blocks.

The present invention includes a contactor having a design capable of accepting any combination or number of contact modules, up to the maximum quantity it is designed for. The contactor shown in FIGS. 1, 5, and 6 may include a plurality of open spaces, six shown for exemplary purposes only, any number of which may be filled by contact modules 330. The initial state of the contacts can be changed depending on positioning as will be further discussed. The contact module 330 could be any standard or non-standard amperage rating, and may have multiple poles (sets of contacts) within it. The attachment is made with either a fastener, or snap fit that allows the installer to add or remove modules on an as needed basis. The contact module 330 contains both stationary and moveable contacts, which enable the contactor 10 to hold any select number of contact modules 330 thereon.

Figure 7:
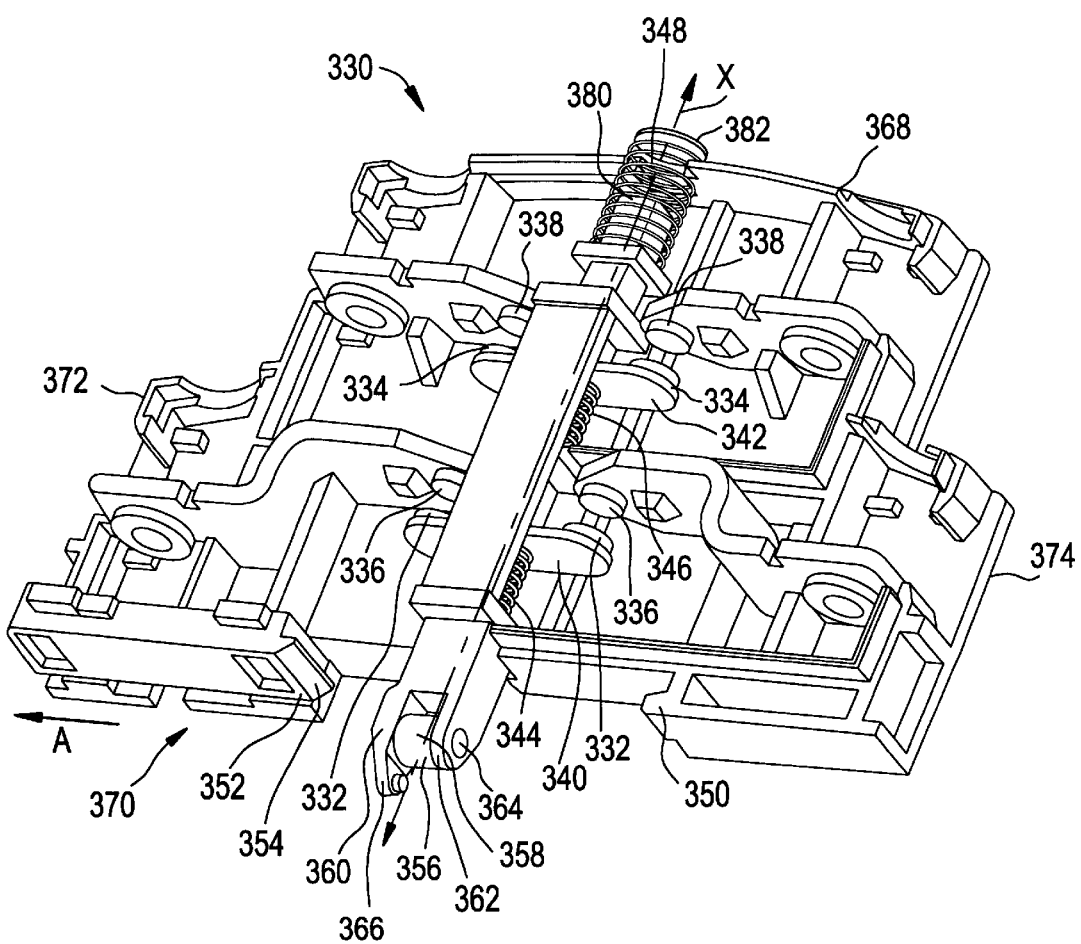
FIG. 7 shows a front perspective view of a contact module interior for use with the contactor of FIG. 1 wherein the contact module is biased to have normally open contacts.
Figure 8:
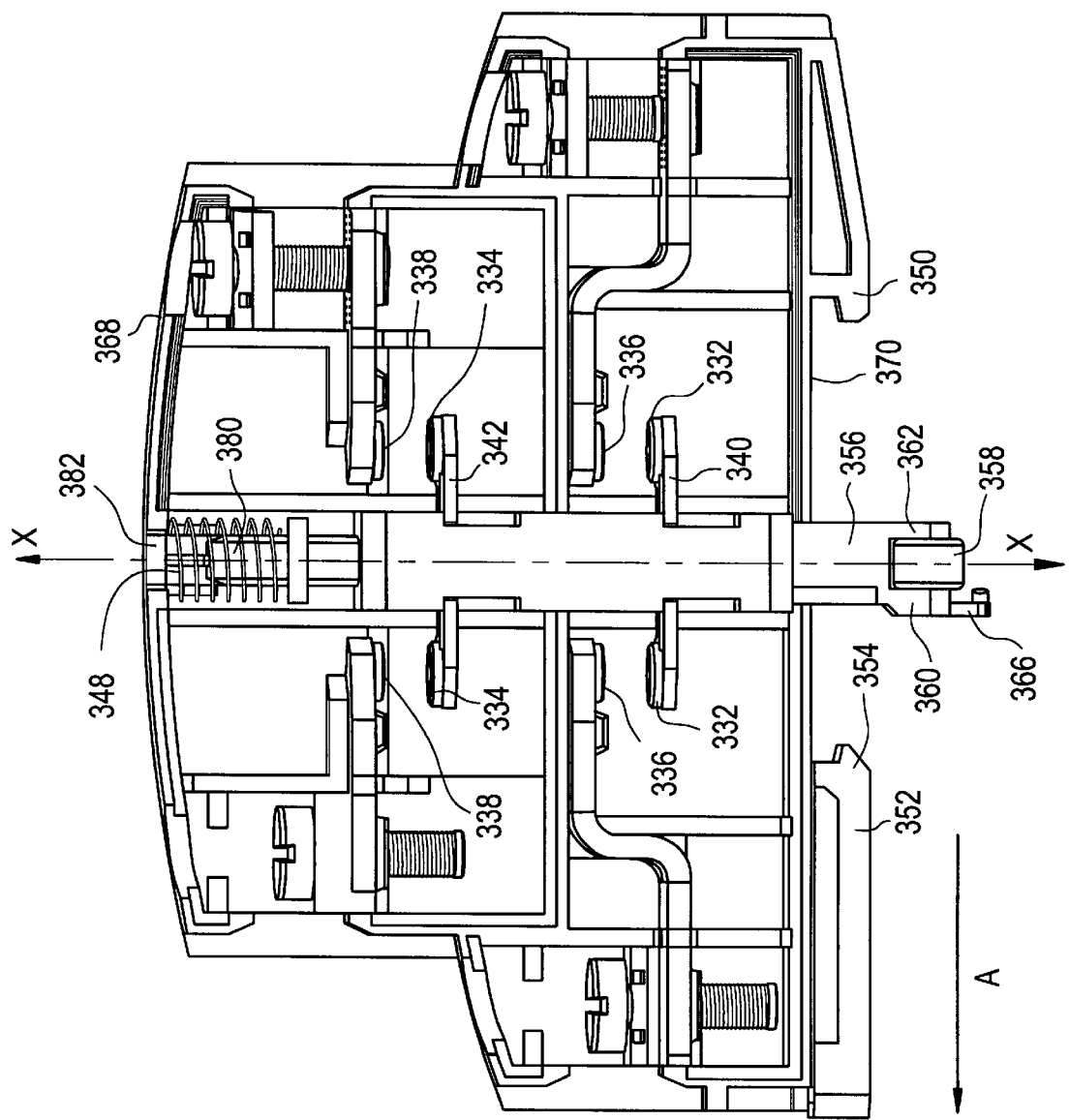
FIG. 8 shows a front plan view of the contact module interior of FIG. 7.

In a presently preferred embodiment of a contact module, as shown in FIGS. 7–8, the contacts can be arranged such that they are in a normally closed position when the cam follower is upon a raised surface. The contact module 330 is shown to include two pairs of moveable contacts 332, 334 adapted to abut with two pairs of stationary contacts 336, 338, respectively. The contact module 330 as shown in thus a two-pole contact module, however it is within the scope of this invention to utilize single pole contact modules as well, where only moveable contacts 332 and stationary contacts 336 are utilized. In some cases, it may even be desirable to have more than two-poles of contacts within a single contact module. In the two pole embodiment shown, the moveable contacts 332, 334 are provided on the module plates 340, 342, respectively. The contact module 330 as shown in FIGS. 7 and 8 is in its normally biased condition, in a normally open state. Springs 344, 346, and 348 bias the contact module in this condition.

Contact module 330 further includes a hook-like projection 350 and a spring biased din clip 352 for securing the contact module to the attachment areas 85. For attachment, an installer need only pull the din clip 352 to the outer side of the contact module 330 in direction A, hook the projection 350 within an attachment area 85 adjacent the first or second side 14, 16 of the contactor 10, and release the din clip 352 so that it returns to its biased condition and seats the projection 354 of the din clip 352 within an attachment area 85 adjacent the other of the first or second side 14, 16.

When the contact module 330 is attached to the contactor 10, the cam follower 356 may either be aligned with the first side 302 or the second side 304 of the cam profile leg 26. The cam follower 356 may include a roller 358 attached between first and second flanges 360, 362 by a pin 364 upon which the roller 358 may freely rotate. The first flange 360 preferably includes an extension 366 which may be seated within a slot 301. If the extension 366 is seated within a slot 301 on the first side 302 of the cam profile leg, then the contact module 330 will be a "normally closed" contact module because the cam follower 356 will be placed on raised surface 306 forcing the moveable contacts 332, 334 into contact with the stationary contacts 336, 338. When the contactor is energized, the main cam 24 will move towards the top side 18 the slope 308 will move underneath the cam follower 356, specifically the roller 358, until the roller 358 is seated upon flat surface 300. Thus, in this energized state, the contacts within the contact module will return to its biased condition where the contacts are open, that is, separated.

To turn the contact module 330 into a "normally open" contact module, the contact module 330 need only be rotated about the axis X (the axis passing through the springs 344, 346, 348) 180 degrees so that the extension 366 may be seated within a slot 301 on the second side 304 of the cam profile leg 26. With the extension 366 seated within a slot 301 on the second side 304, the cam follower 356 is positioned on the flat surface 300. With the cam follower on the flat surface 300, the contact module is in its biased state as shown in FIG. 5 with the contacts separated. Thus, in this "normal" state of the contactor, the contact module is "normally open". When the contactor is energized, the main cam 24 will again move towards the top side 18 moving the slope 312 underneath the roller 358 until the roller 358 is seated upon the raised surface 310. With the cam follower on the raised surface 310, the module plates 340, 342 are pushed towards an exterior side 368 (opposite an attachment side 370) of the contact module 330 moving the movable contacts 332, 334 into an abutting relation with the stationary contacts 336, 338. Thus, the contacts within the contact module 330 are only closed when the contactor 10 is energized, and thus the contact module 330 with the extension 366 positioned within the slot 301 on the second side 304 of the cam profile leg 26 is "normally open".

Plunger 380 within the contact module 330 moves correspondingly with the cam follower 356, module plates 340, 342, and within the spring 348 along the longitudinal axis X. The plunger 380 is visible through window 382 along exterior side 368 of the contact module 330. Thus, if the plunger 380 is recessed from the window 382, it can be determined that the contacts within are separated and if the plunger 380 is within the window 382 and up against exterior side 368 (i.e. not recessed), then it can be determined that the movable contacts 332, 334 are abutting the stationary contacts 336, 338. Thus, the plunger 380 can be used to indicate contact state.

Figure 9:
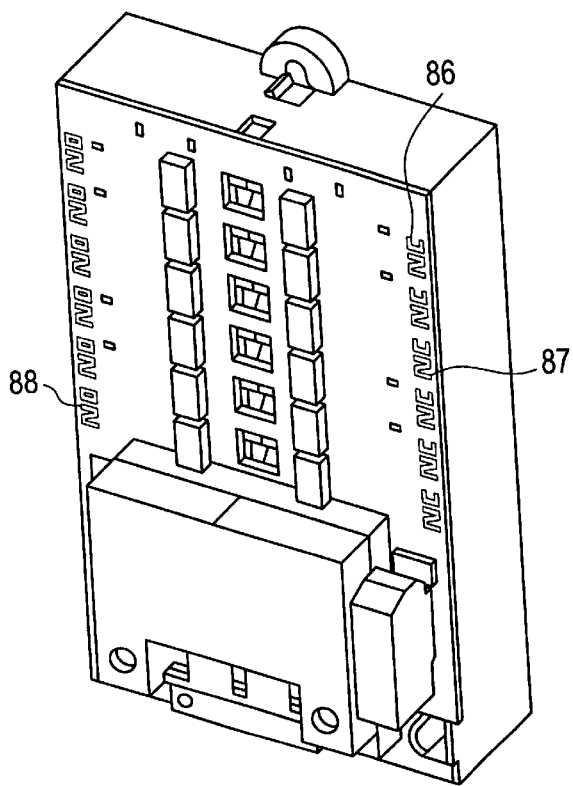
FIG. 9 shows a front perspective view of the contactor of FIG. 1 assembled.
Figure 10:
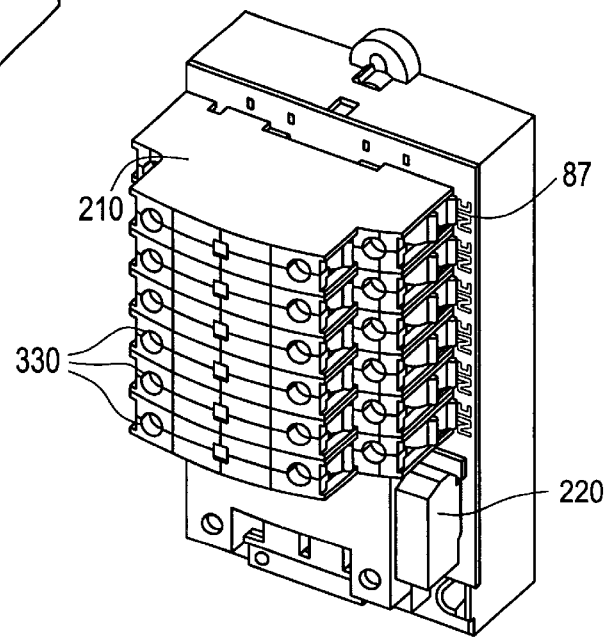
FIG. 10 shows a front perspective view of the contactor of FIG. 1 with contact modules positioned thereon.
Figure 11:
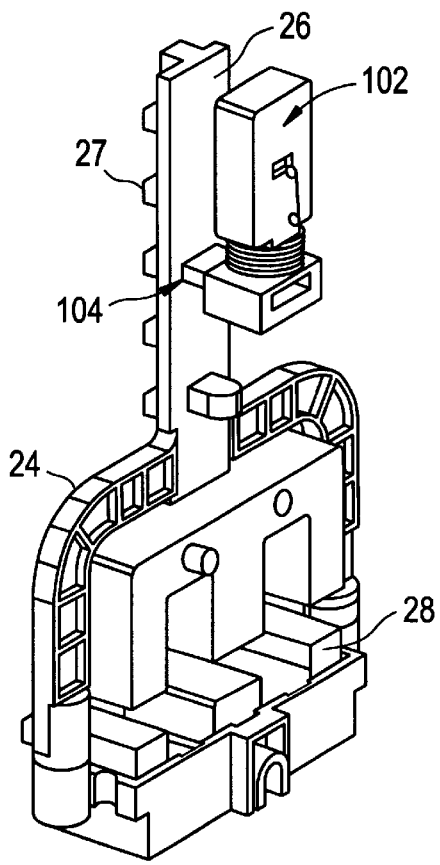
FIG. 11 shows a rear perspective view of a latch assembly and main cam for the contactor of FIG. 1.
Figure 12:
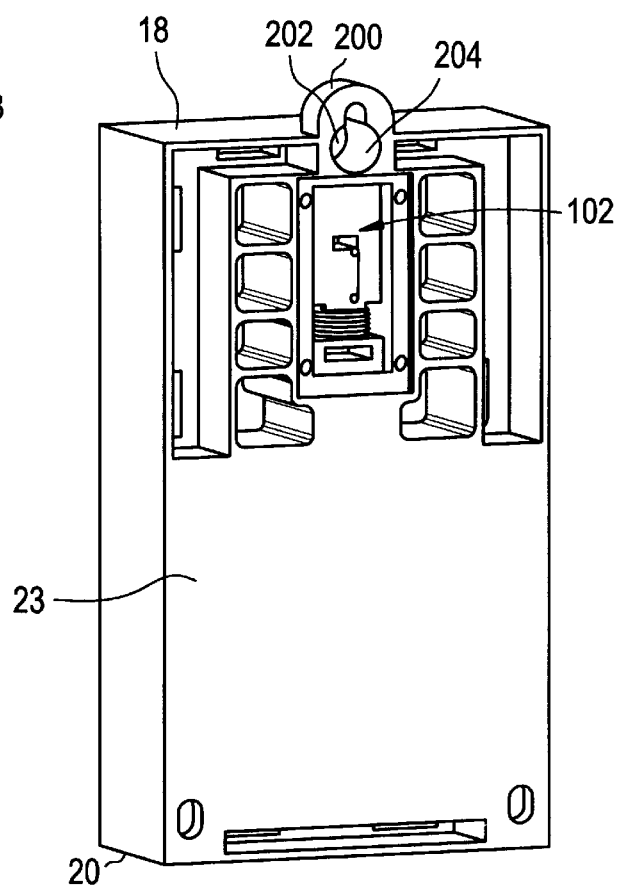
FIG. 12 shows a rear perspective view of the latch assembly of FIG. 11 positioned within the contactor of FIG. 1.

As shown in FIGS. 9 and 10, a contactor 10 may include indicia 86 for providing an indication of whether the contacts mounted upon the contactor 10 will be normally closed "NC" 87 or normally open "NO" 88. The contact block 210, comprising a plurality (six) of contact modules 330, in FIG. 7 is shown placed upon the main cover 70 such that only the "NC" indicia 87 remains visible. Thus, the installer of the contact block 210 is made aware that he has installed the contact block 210 such that the contact pairs contained therein will be normally closed in a normal (off) state of the contactor 10. Alternatively, the contact block 210 could have been placed onto the contactor 10 such that only the NO indicia 88 remained visible, thus indicating that the contacts contained therein would remain normally open in a normal (off) state of the contactor 10. Thus, the choice to transition from NO to NC may be made at the field, and is easily interchangeable without the need to disassemble either the module 330 or the contactor 10.

Also shown in FIGS. 9 and 10 is an auxiliary contact block 220 that is placed upon the location 95 shown in FIGS. 5–6 for receiving auxiliary contact modules. Such an auxiliary contact block 220 may also be easily added on to the contactor 10 in the field location. An additional contact block 220 may also be added, although not shown in these perspective views.

Movement of the cam profiles 27 on the cam profile leg 26 is accomplished by energizing the coil 94 which in turn magnetizes the magnet 52 forcing the armature 28 in the direction towards the top side 18. Movement of the armature 28 results in subsequent movement of the main cam 24, to which it is attached, thus translating into movement of the cam profile leg 26. Thus, the cam profiles 27 accessed through the openings 84 change position depending on whether the coil 94 is energized or de-energized. A contact module 330 attached to the front surface 76 of the cover 70 positions a cam follower 356 in abutment with a select location along the cam profile 27 to where the contacts contained therein are either normally open or normally closed. Preferably, indicia indicating the initial status of the contacts when the contactor 10 is de-energized remains visible on the main cover 70.

Turning now to FIGS. 11–17, the contactor 10 of the present invention preferably further includes a latch assembly 102 for enabling the contactor 10 to be usable as either a mechanically held or electrically held contactor. Electrically held contactors will remain closed only while power is applied to the control coil. Mechanically held contacts will remain closed even when control power is removed. Thus, the present invention provides a single unit that can be configured as either a mechanical or electrical held contactor. The latch assembly 102 may be trapped within the rear 23 of the base 12 and then closed with a cover 100 shown in FIG. 1. The latch assembly 102 is preferably actuated by the main cam 24 through a connector 104 extending rearwardly from the cam profile leg 26. That is, the cam profiles 27 extend from a front surface of the cam profile leg 26 and the connector 104 preferably extends from a rear surface of the cam profile leg 26.

With the latch assembly 102 fitted as shown, when the coil of the contactor is energized—the armature 28, armature holder 50, and main cam 24 are moved towards side 18. Consider this as Position 1 for the main cam 24 and plunger of the latch assembly 102. Thereafter, even if the supply to the coil is discontinued, through electronic circuit 150 (shown in FIG. 18—the electronic circuit 150 cuts out coil control power and receives feedback from the auxiliary contact block 220 and control signal to ensure proper control sequence and indication), the main cam 24 is held towards the side 18 against the spring bias which is trying to push it back towards the side 20. Consider this as Position 2 for the main cam 24 and plunger. Holding back of the main cam 24 towards side 18 at Position 2, is achieved by the latch assembly 102. From the Position 1, the main cam 24 and plunger move only a small pre-designed distance away to the position 2. At the position 1 or position 2, the profiles on the main cam to actuate the contact modules 330 are at the same level. Hence the contacts maintain the same actuated status when the main cam 24 is at position 1 or position 2. However, in position 2, the armature 28 and armature holder 50 return back to the original position (i.e. at the position nearest to side 20 due to gravity or due to a separate spring bias). If at this state the coil is energized again, the armature 28 and armature holder 52 is attracted towards the magnet 52 which pushes the main cam 24 and plunger from the position 2 to the position 1. In this sequence, when the coil is de-energized, the main cam 24 and plunger of the latch assembly 102 is not held at position 2, but instead travels further towards the side 20, at the position 3. The position 3 is same as the starting position, at which all contacts return to their normal state.

Thus, when the main cam 24 travels from position 3 to position 1 due to coil energization, it goes to position 2 after de-energization of the coil. But, if it travels from Position 2 to Position 1 due to coil energization, it goes to Position 3 after de-energization of the coil. Hence, with successive sequence of energization and de-energization of coil, the main cam can be held in ON or OFF states while keeping the coil de-energized in both states.

Figure 13:
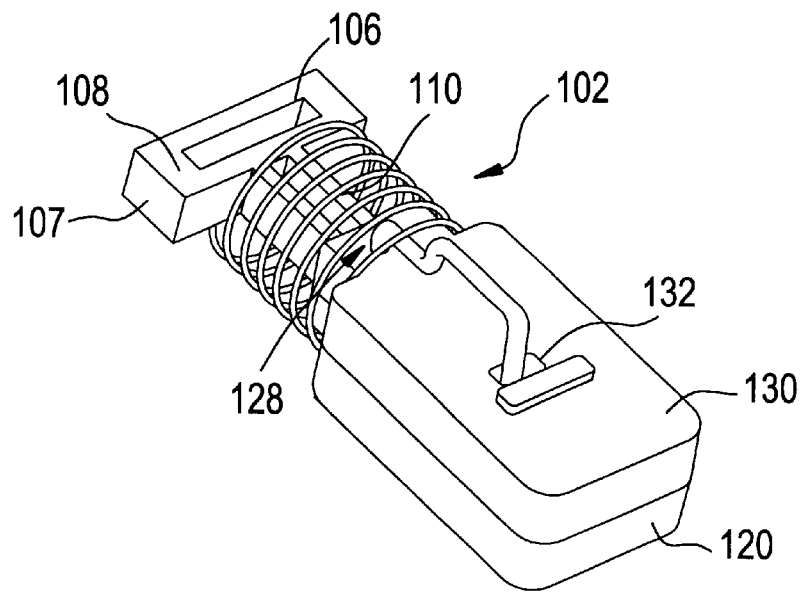
FIG. 13 shows a perspective view of the latch assembly.
Figure 14:
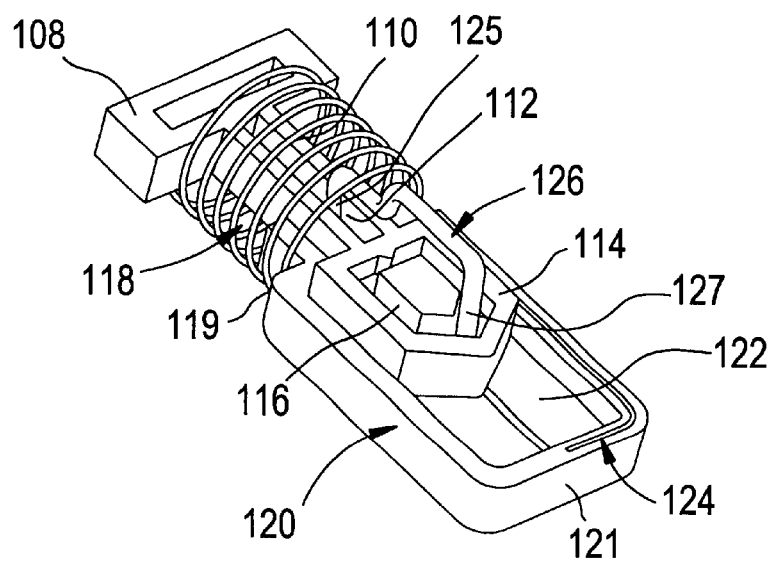
FIG. 14 shows a perspective view of the latch assembly of FIG. 13 with the latch cover removed.

Turning now to FIGS. 13–14, the latch assembly 102 is shown to include a latch plunger 107. The latch plunger 107 includes a head portion 108 having a slot 106 for accepting the connector 104 extending from the cam leg 26. Thus, movement of the cam leg 26 will correspond with movement of the latch plunger 107. The latch plunger 107 further preferably includes a neck portion 110 having a slot 112 sized to accept the first end 125 of a latching bar 126. Finally, the latch plunger 107 includes a main body portion 114 containing a closed loop pathway 116 for receiving a second end 127 of the latching bar 126. The main body portion 114 of the latch plunger 107 is slidably received in a chamber 122 formed by a latch assembly base 120 and latch assembly cover 130. The main body portion 14 is movable from a bottom end 119 to a top end 121 of the chamber 122. The latching bar 126 extends through opening 128 and rectangular aperture 132 in the latch assembly cover 130. Positioned between the bottom end 119 of the chamber 122 and the head portion 108 of the latch plunger 107 is a return spring 118 which applies pressure on the latching bar 126 and pushes the plunger 107 back after de-latching as will be described. An ultrasonic welding nib 124 may be further included on the base 120.

Figure 15:
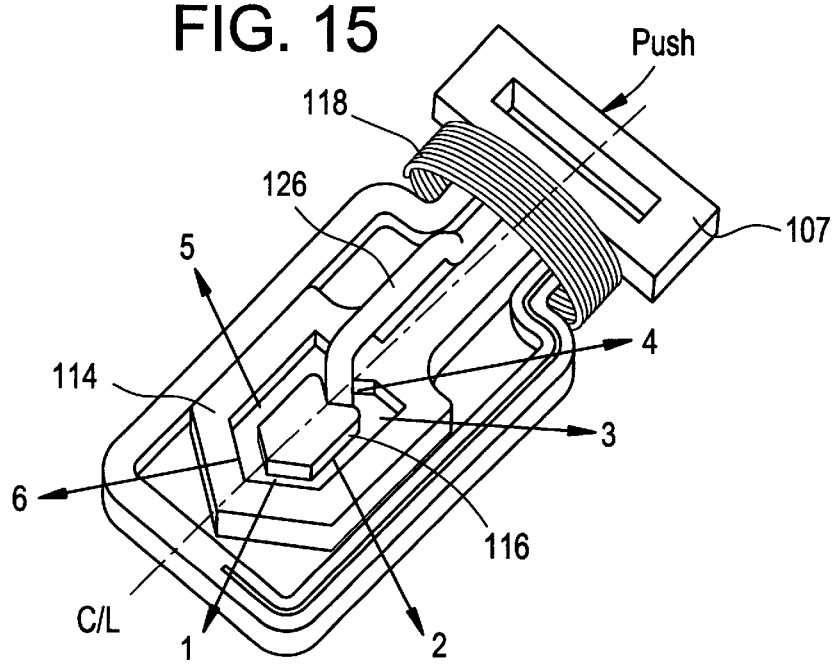
FIG. 15 shows a perspective view of the latch assembly of FIG. 14 with the spring compressed.
Figure 16:
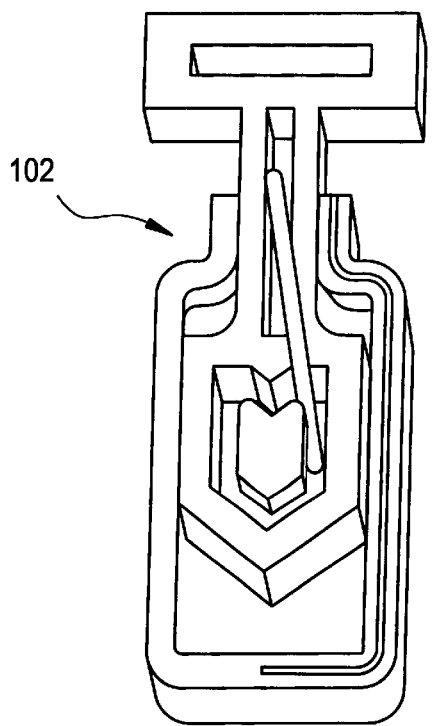
FIG. 16 shows a front perspective view of the latch assembly of FIG. 13 in a latching mode of operation.
Figure 17:
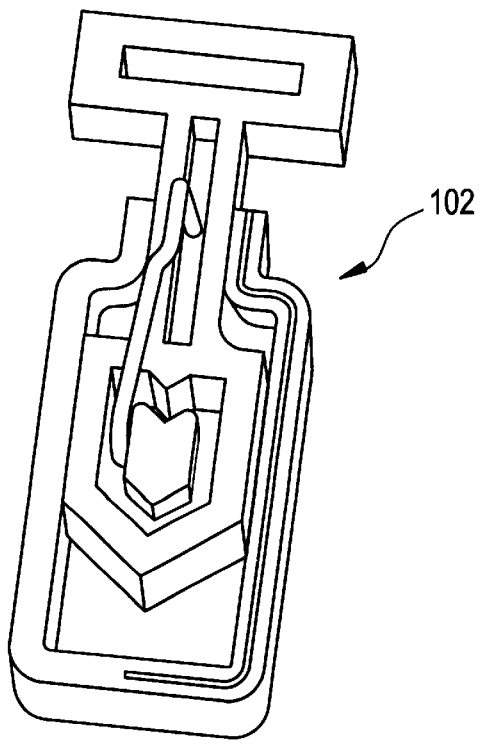
FIG. 17 shows a front perspective view of the latch assembly of FIG. 13 in an unlatching mode of operation.

Turning now to FIGS. 15–17, the motion of the latch plunger 107 with respect to the latching bar 126 will now be described. The initial de-energized state of the contactor 10 corresponds to the latch plunger 107 position shown in FIG. 14 with the latching bar 126 within path 1 of the pathway 116. This position of the latch plunger 107 and latching bar 126 corresponds to Position 3 as described above. When the contactor is energized (i.e. the electromagnet is energized by the coil causing the armature to move towards the electromagnet, thereby pushing the main cam 24 towards the top side 18), the cam leg 26 and connector 104 move towards the top side 18 correspondingly pushing the latch plunger 107 in the direction indicated in FIG. 15. The latching path is demonstrated in FIG. 16 as the main body portion 114 moves closer to the top end 121. The latching bar 126 is restricted from linear movement by the small opening 128 in the latch assembly cover 130 through which the latching bar 126 passes. The latching bar 126 is, however, allowed to move slightly from side to side due to rectangular aperture 132 in the latch assembly cover 130. Thus, when the main body portion 114 moves towards the top end 121, the second end 127 of the latching bar 126 is allowed to follow the counterclockwise latching pathway 116 because path 1 is at a lower level than path 6 (so the latch will not move towards path 6 from path 1. Also, the center of the latching bar 126 diameter is off center from the latch plunger 107 center line C/L towards path 2, which also encourages counterclockwise placement of the latching bar 126. As the main body portion 114 is pushed further, the latching bar 126 rises over the path 2 slope and then falls into the path 3 from where it slides down and falls into the latching position (path 4). As shown in FIG. 15, the latching bar 126 is latched.

Energization of the contactor 10 results in the latch plunger 107 moving towards the top side 18 of the contactor thus situating the latching bar 126 within path 3, or position 1 as previously described. When the contactor is de-energized, the latch plunger 107 moves slightly towards the bottom side 20 of the contactor until the latching bar 126 is caught within the path 4—the latching position. Thus, the contactor 10 is de-energized, but mechanically held to retain the contacts within the contact modules as if the contactor were energized.

When the contactor 10 is re-energized, the latch plunger 107 moves again towards the top side 18 of the contactor, just enough to move the main body portion 114 to situate the latching bar 126 within path 5. Movement to path 5 is made possible because path 3 is at a higher level than path 4, and thus movement from path 4 to path 5 is the path of least resistance. Also, the center of the latching bar 126 diameter in path 4 is off center from the plunger center-line C/L towards path 5, which also encourages counterclockwise placement of the latching bar 126. The unlatching of the latch plunger is demonstrated in FIG. 17. Continual movement of the latch plunger 107 towards the bottom side 20 of the contactor 10 (due to movement of the cam leg 26 as well as the spring 118 biasing the head portion 108 back to normal position) results in the pathway 116 guiding the latching bar 126 up through the path 6 slope and finally falling back into the unlatched position, path 1, corresponding to Position 3 as described above.

Figure 18:
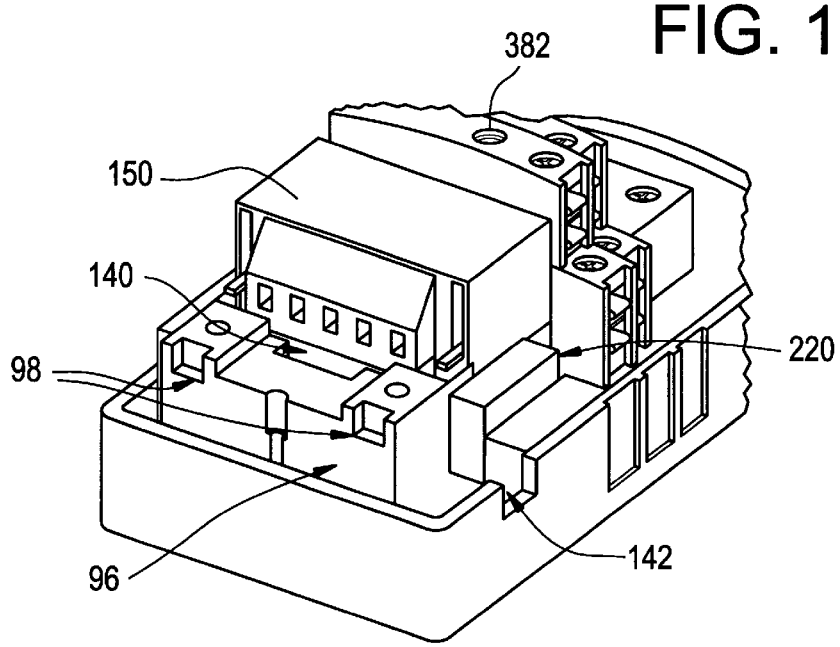
FIG. 18 shows a side perspective view of the contactor of FIG. 1 with an electronic circuit positioned on the coil cover.

FIG. 18 demonstrates the electronic circuit 150 positioned on the coil cover 96. As discussed above with respect to FIGS. 11–17, the electronic circuit 150 will disconnect the coil supply after a predetermined time interval such that the main cam 24 will have by then latched in the energized position. The auxiliary contact block 220 may provide feedback to the electronic circuit 150 as to the contact state for the mechanically held version of the contactor 10. FIG. 18 further shows the apertures 98 for coil terminals and an aperture 140 to view the coil rating which may be marked on the bobbin 60. Additionally, cutouts 142 (one on each side 14, 16) on the base 12 receive protrusions 144 on the main cam 24 and enable protrusions 144 to be manually accessed through cutouts 142 for manual actuation of the main cam 24.

Figure 19:
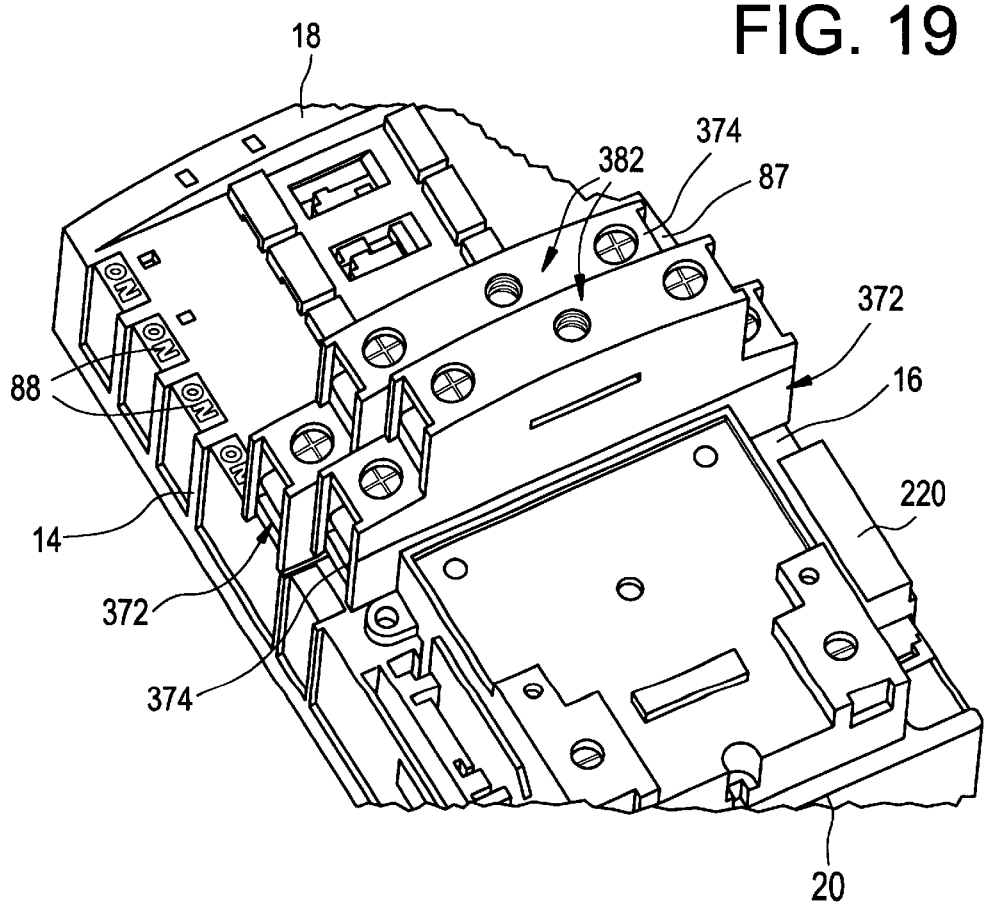
FIG. 19 shows a front perspective view of the contactor of FIG. 1 with two contact modules positioned thereon; and, FIG. 20 shows a front perspective view of a contact module interior for use with the contactor of FIG. 1 wherein the contact module is biased to have normally closed contacts.

FIG. 19 demonstrates how identical contact modules 330 can be used in varying initial states. Depending on how the contact module 330 is placed, it becomes either "normally open" or "normally closed". For reference, a first side 372 of the contact modules 330 and a second side 374 of the contact modules 330 are shown. The contact module 330 closer to side 18 is a "normally closed" contact module because first side 372 is placed adjacent to side 14, thus cam follower 356 is placed against raised surface 306 causing the contacts therein to be closed in an OFF state (de-energized) of the contactor 10. To indicate the contact state, the letters "NO" 88 are covered by a lower surface of the din clip 352 so that the letters "NC" 87 remain visible thus indicating that the contact module 330 is "normally closed". The contact module 330 closer to side 20 is a "normally open" contact module because first side 372 is placed adjacent to side 16, thus cam follower 356 is placed against flat surface 300 on side 304 of the cam leg 26 allowing the contact to remain open in an OFF state (de-energized) of the contactor 10. To indicate the contact state, the letters "NC" 87 are covered by a lower surface of the din clip 352 so that the letters "NO" 88 remain visible thus indicating that the contact module 330 is "normally open". In either case, a user will be able to tell whether or not the contacts contained within the contact modules 330 are in an abutting relationship by looking at the plunger 380 through the window 382. In combination with the NC or NO indicia, this will provide an indication as to whether or not the contactor 10 is energized. That is, if the contact module 330 is indicated as an NC contact module 330, but the plunger 380 is recessed from the window 382, than the contactor 10 is energized. If the plunger 380 is within the window 382, than the contactor 10 is de-energized. Likewise, if the contact module 330 is indicated as an NO contact module 330, but the plunger 380 is within the window 382, then the contactor 10 is energized, and if the plunger 380 is recessed from the window 382 then the contactor 10 is de-energized.

Figure 20:
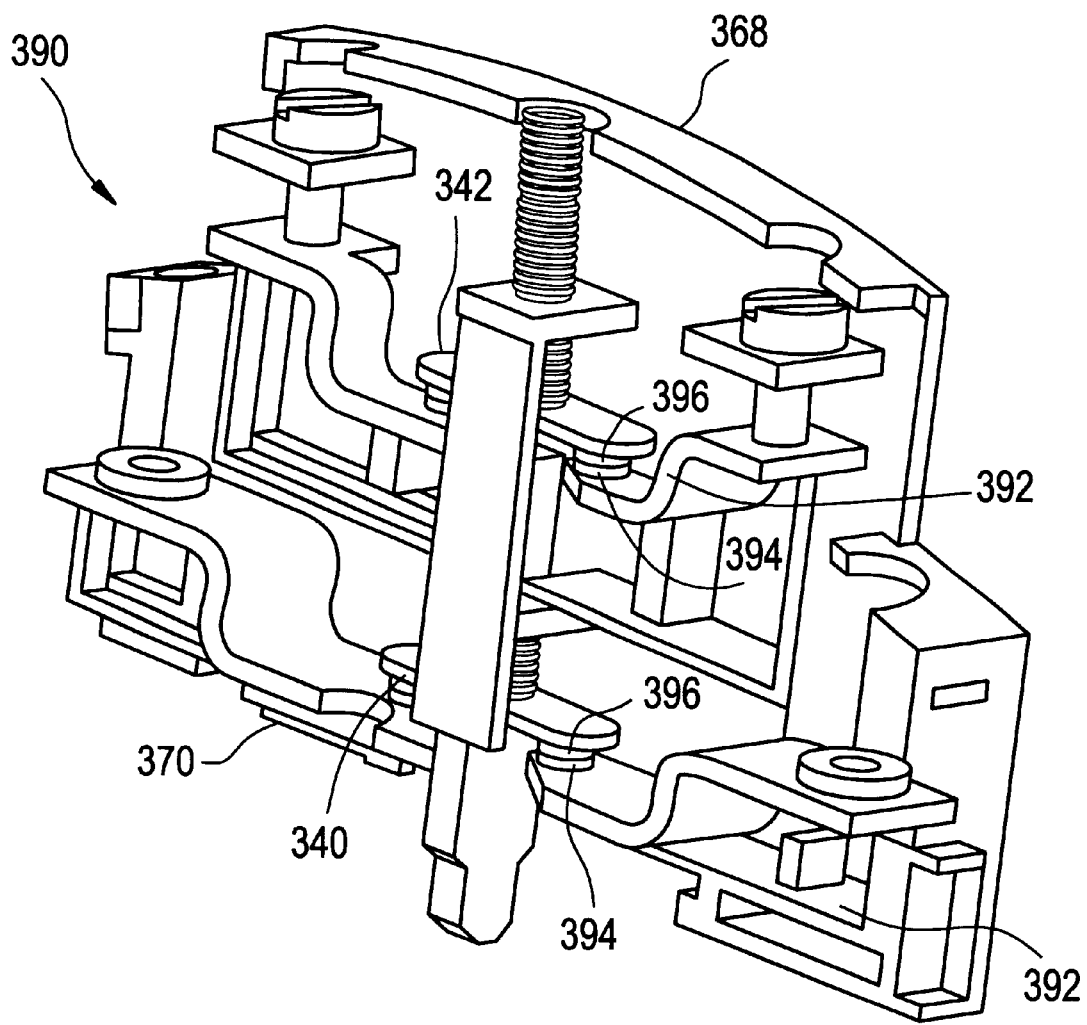

While a specific design has been discussed wherein the contact module 330 is in the biased condition of being normally open as shown in FIGS. 7 and 8, it should be understood that the contact module 330 could be redesigned to be biased in a normally closed state as shown in FIG. 20. The contact module 390 is shown to include straps 392 which face the contact surface of the stationary contacts 394 towards the exterior side 368 of the contact module 390 and the module plates 340, 342 now carry movable contacts 396 such that their contact surfaces face the attachment side 370 of the contact modules 390. It is presently preferred, however, that the contact modules 330 are biased to a normally open state (pre-installation) and the installer may then select the initial state of the contacts, whether that be normally open or normally closed, when attaching the contact modules 330 to the contactor 10 at the field.

The contactor 10 of the present invention thus provides many benefits to the customer wishing to configure the contactor 10 at the field. The frame is designed to accept any combination of contact modules 330, up to the maximum quantity it was designed for. It is estimated that the SKU's can be reduced by a factor of 50:1. The customer need only pay for contact modules 330 that are going to be used, and can always upgrade the number as needed. The present invention further involves the use of a cam driven contact design, so that one can link contact position to the mounting of the contact module 330 relative to the operating cam 27 in the base 12. Thus, the present invention provides easily field configurable contactors 10 for applications having both normal open NO and normal closed NC poles, and the customer need not restrict himself to one or the other. Additionally, the application can be changed without disassembling the contactor 10. The present invention further involves the capability of configuring a contactor 10 as either a mechanically held or electrically held contactor 10 without adding any accessories to the unit. This is done by redesigning the contactor to utilize a latching mechanism 102. Additionally, the contactor 10 may advantageously be assembled in what is termed "top down assembly" by beginning assembly with the rear 23 of the contactor and ending with the front 78.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A field installable and configurable contact module comprising:
   a housing;
   a terminal strap positioned within the housing, the terminal strap having a first end and a second end;
   a stationary contact positioned on the first end of the terminal strap;
   a spring-biased cam follower;
   a plunger extending from the cam follower and through the housing, the plunger movable with the cam follower;
   a spring positioned about the plunger for biasing the cam follower;
   a module plate extending from the plunger, the module plate movable with the plunger and cam follower; and,
   a movable contact on the module plate, the movable contact movable with the module plate;
   wherein the movable contact is separated from the stationary contact in a first position of the cam follower and wherein the movable contact abuts the stationary contact in a second position of the cam follower.

2. The contact module of claim 1 further comprising a pair of movable contacts on the module plate, a pair of terminal straps, each terminal strap having a stationary contact positioned on a first end thereon for abutment with a respective movable contact in the second position of the cam follower.

3. The contact module of claim 2 wherein the module plate is a first module plate and the pair of terminal straps is a first pair of terminal straps, the contact module further comprising a second module plate carrying a pair of movable contacts and a second pair of terminal straps, each terminal strap in said second pair of terminal straps having a stationary contact positioned on a first end thereon for abutment with a respective movable contact in the second position of the cam follower.

4. The contact module of claim 1 wherein the spring biases the cam follower in the first position.

5. The contact module of claim 4 wherein movement of the cam follower to the second position compresses the spring.

6. The contact module of claim 1 wherein the cam follower includes first and second flanges holding a roller therebetween, the roller having a rolling surface movable about a pin connecting the first and second flanges.

7. The contact module of claim 6 wherein the first flange includes an extension extending past the rolling surface and in a direction away from the contact module.

8. The contact module of claim 1 wherein the housing has an attachment end through which the cam follower extends and an exterior end to which the spring is connected.

9. The contact module of claim 8 wherein the attachment end of the housing includes a hook and a spring biased din clip.

10. The contact module of claim 9 wherein the din clip is spring biased in a direction pointing towards the cam follower and forcibly movable along the attachment end in a direction away from the cam follower.

11. The contact module of claim 8 further comprising a window in the exterior end of the housing through which plunger location is visible.

12. The contact module of claim 1 wherein the cam follower and plunger share a longitudinal axis and movement of the cam follower from the first position to the second position is along the longitudinal axis.

13. The contact module of claim 12 wherein the spring has a spring axis lying generally along the longitudinal axis of the cam follower.

14. The contact module of claim 13 wherein the module plate is positioned generally perpendicularly to the longitudinal axis of the plunger.

15. In combination, a contactor for receiving contact modules and a contact module receivable in the contactor, the combination comprising:

a contactor having a cover, the cover having cam openings, each cam opening providing access to first and second cam profiles raised from first and second sides of a flat surface, respectively, each cam profile including a raised surface and a sloped surface connecting the raised surface to the flat surface;

a contact module having a housing, a stationary contact positioned within the housing, a spring-biased cam follower protruding from the housing, a spring for biasing the cam follower, a plunger extending from the cam follower and through the housing, the plunger movable with the cam follower, a module plate extending from the plunger, the module plate movable with the plunger and cam follower, a movable contact on the module plate, the movable contact movable with the module plate, wherein the cam follower is movable along its longitudinal axis from a first position where the movable contact abuts the stationary contact to a second position where the movable contact is separated from the stationary contact, wherein initially positioning the cam follower of the contact module upon the first cam profile results in a normally closed contact module with the cam follower placed on a raised surface forcing the cam follower into the second position, and initially positioning the cam follower of the contact module upon the second cam profile results in a normally open contact module with the cam follower resting on a flat surface and allowing the cam follower to be in the first position.

16. The combination of claim 15 wherein each cam profile is electromagnetically driven from a normal position to an energized position, wherein, in the energized position, the first cam profile is moved underneath the normally closed contact module to place the cam follower on the flat surface and in the first position, and the second cam profile is moved underneath the normally open contact module to place the cam follower upon a raised surface and in the second position.

17. The combination of claim 15 wherein the contactor comprises a main cam having a cam profile leg supporting the cam profiles.

18. The combination of claim 17 wherein the main cam further comprises a pair of supporting arms, an armature positioned between the pair of supporting arms.

19. The combination of claim 18 further comprising an electromagnet positioned adjacent the armature.

20. The combination of claim 19 wherein the contactor includes a top side and a bottom side, the main cam biased towards the bottom side, wherein energization of the electromagnet moves the armature towards the electromagnet and towards the top side of the contactor, the armature pushing the main cam towards the top side of the contactor against its bias.

21. The combination of claim 20 wherein the contactor further comprises a latch assembly for mechanically latching the contactor when the contactor is de-energized.

22. The combination of claim 21 wherein the latch assembly unlatches when the contactor is re-energized.

23. The combination of claim 21 wherein the cam profile leg has a front side supporting the cam profiles and a rear side, the latch assembly positioned adjacent the rear side of the cam profile leg, the latch assembly including a latch plunger having a head portion, neck portion, and main body portion, a latch assembly base, a latch assembly cover, and a latching bar having a first end and a second end, the head portion of the latch plunger connected with the cam profile leg for movement corresponding to the cam profile leg, the neck portion having a slot for receiving the first end of the latching bar, the main body portion having a closed-loop pathway for receiving the second end of the latching bar, the main body portion slidably received within a chamber created by the latch assembly cover and the latch assembly base, the first end of the latching bar extending through an opening in the latch assembly cover which prevents linear movement of the latching bar and the second end of the latching bar extending through an aperture of the cover which allows sideways movement of the latching bar, wherein movement of the cam profile leg due to energization of the electromagnet pushes the latch plunger into the chamber allowing the second end of the latching bar to fall into a latching path of the closed-loop pathway for remaining latched during de-energization of the electromagnet, and wherein movement of the cam profile leg due to re-energization of the electromagnet pushes the latch plunger into the chamber and allowing the latching bar to move out of the latching path of the closed loop pathway for becoming unlatched during subsequent de-energization of the electromagnet.

24. The combination of claim 18 further comprising a cam profile on each of the supporting arms for changing the state of auxiliary contact modules positioned upon the supporting arms.

25. The combination of claim 15 wherein the cover further comprises first indicia and second indicia for indicating whether the contact module is normally open or normally closed, respectively.

26. The combination of claim 25 wherein the second indicia remains visible and the first indicia is covered by the contact module when the cam follower of the contact module is positioned on the first cam profile and wherein the first indicia remains visible and the second indicia is covered by the contact module when the cam follower of the contact module is positioned on the second cam profile.

27. A latch assembly for mechanically holding a contactor during de-energization of the contactor, the latch assembly comprising:

a latching bar having a first end and a second end;

a latch plunger, the latch plunger having a head portion, a neck portion, and main body portion;

the head portion of the latch plunger for connecting with a connector extending from an electromagnetically driven portion of the contactor;

the neck portion of the latch plunger having a slot for receiving the first end of the latching bar;

the main body portion containing a closed loop pathway for receiving the second end of the latching bar; and, a latch assembly base and a latch assembly cover forming a chamber for receiving the latch plunger therein, the latch plunger slidable from a bottom end to a top end of the chamber;

wherein the first end of the latching bar extends through an opening in the latch assembly cover and the second end of the latching bar extends through an aperture in the latch assembly cover.

28. The latch assembly of claim 27 further comprising a spring positioned between the head portion of the latch plunger and the bottom end of the chamber.

29. The latch assembly of claim 27 wherein the closed loop pathway includes a first V-shaped portion corresponding to an unlatched position of the second end of the latching bar and a second V-shaped portion corresponding to a latched position of the second end of the latching bar.

30. The latch assembly of claim 29 wherein the closed loop pathway includes paths connecting the first V-shaped portion to the second V-shaped portion which slope upwardly and then downwardly, and wherein the second end of the latching bar slides along the slopes of the paths and portions of the pathway as the plunger is pushed into or pulled out of the chamber.

31. The latch assembly of claim 30 wherein the second end of the latching bar moves in a counterclockwise direction about the closed loop pathway during changing states of the contactor.

32. A contactor comprising:
   a top side and a bottom side;
   a main cam biased towards the bottom side and having a cam profile leg and a pair of supporting arms;
   an armature positioned between the pair of supporting arms;
   an electromagnet positioned adjacent the armature, energization of the electromagnet moving the armature towards the electromagnet and towards the top side of the contactor, the armature pushing the main cam towards the top side of the contactor against its bias; and,
   a latch assembly for mechanically latching the contactor when the electromagnet is de-energized and unlatching when the electromagnet is re-energized.

33. The contactor of claim 32 wherein the cam profile leg has a front side and a rear side, the latch assembly positioned adjacent the rear side of the cam profile leg, the latch assembly including a latch plunger having a head portion, neck portion, and main body portion, a latch assembly base, a latch assembly cover, and a latching bar having a first end and a second end, the head portion of the latch plunger connected with the cam profile leg for movement corresponding to the cam profile leg, the neck portion having a slot for receiving the first end of the latching bar, the main body portion having a closed-loop pathway for receiving the second end of the latching bar, the main body portion slidably received within a chamber created by the latch assembly cover and the latch assembly base, the first end of the latching bar extending through an opening in the latch assembly cover which prevents linear movement of the latching bar and the second end of the latching bar extending through an aperture of the cover which allows sideways movement of the latching bar, wherein movement of the cam profile leg due to energization of the electromagnet pushes the latch plunger into the chamber allowing the second end of the latching bar to fall into a latching path of the closed-loop pathway for remaining latched during de-energization of the electromagnet, and wherein movement of the cam profile leg due to re-energization of the electromagnet pushes the latch plunger into the chamber and allowing the latching bar to move out of the latching path of the closed loop pathway for becoming unlatched during subsequent de-energization of the electromagnet.

34. The contactor of claim 32 further comprising a cover, the cover having openings providing access to the cam profile leg.

* * * * *